United States Patent
Tsunekawa

(10) Patent No.: US 8,377,270 B2
(45) Date of Patent: Feb. 19, 2013

(54) PLASMA PROCESSING APPARATUS, MAGNETORESISTIVE DEVICE MANUFACTURING APPARATUS, MAGNETIC THIN FILM FORMING METHOD, AND FILM FORMATION CONTROL PROGRAM

(75) Inventor: Koji Tsunekawa, Hachioji (JP)

(73) Assignee: Canon Anelva Corporation, Kawasaki-shi (JP)

( * ) Notice: Subject to any disclaimer, the term of this patent is extended or adjusted under 35 U.S.C. 154(b) by 63 days.

(21) Appl. No.: 13/126,579

(22) PCT Filed: Oct. 15, 2009

(86) PCT No.: PCT/JP2009/067826
§ 371 (c)(1),
(2), (4) Date: Apr. 28, 2011

(87) PCT Pub. No.: WO2010/064493
PCT Pub. Date: Jun. 10, 2010

(65) Prior Publication Data
US 2011/0203734 A1    Aug. 25, 2011

(30) Foreign Application Priority Data
Dec. 3, 2008  (JP) .................................. 2008-308400

(51) Int. Cl.
*C23C 14/00* (2006.01)
*C25B 11/00* (2006.01)
*C25B 13/00* (2006.01)

(52) U.S. Cl. ................................ 204/298.16; 204/298.23

(58) Field of Classification Search ............. 204/298.16, 204/298.23
See application file for complete search history.

(56) References Cited

U.S. PATENT DOCUMENTS 3,341,030 A * 9/1967 Engels ........................... 414/754
6,616,816 B2   9/2003 Sakai .......................... 204/192.1
(Continued)

FOREIGN PATENT DOCUMENTS

| JP | 5-339711 A | 12/1993 |
| JP | 10-102236 A | 4/1998 |
| JP | 10-245675 A | 9/1998 |

(Continued)

OTHER PUBLICATIONS

Tsunekawa, K., "Equipment & Materials Technology for Process", Gekkan Semiconductor World 4 (Monthly Semiconductor World), p. 94 (1997).

(Continued)

*Primary Examiner* — Keith Hendricks
*Assistant Examiner* — Ibrahime A Abraham
(74) *Attorney, Agent, or Firm* — Fitzpatrick, Cella, Harper & Scinto

(57) ABSTRACT

The present invention is to reduce the variation in axis of easy magnetization of a magnetic thin film with respect to a large diameter substrate.

A plasma processing apparatus (1) includes: a substrate holder (11) that supports a substrate (10); a magnet holder (31) that is provided around the substrate holder and supports a magnet (30); a cathode unit (50) that is provided above the substrate, and applied with a discharge voltage; a rotating mechanism (20, 40) that is capable of rotating one or both of the substrate holder and the magnet holder along the planar direction of the process surface of the substrate; a rotational position sensor (25, 45) that detects the rotating positions of the substrate and the magnet; and a control device (60) that controls an operation of each operation element. The control device controls the rotating mechanism of the substrate holder and/or the magnet holder to swingingly vary the relative angle between an axis of easy magnetization set in the process surface of the substrate and the magnetic field generated by the magnet during the formation of the magnetic thin film by sputtering, based on a detection signal from the rotational position sensor.

2 Claims, 17 Drawing Sheets

U.S. PATENT DOCUMENTS

| | | |
|---|---|---|
| 6,743,340 B2 | 6/2004 | Fu .................. 204/192.12 |
| 2002/0017910 A1* | 2/2002 | Sakai .................. 324/750 |
| 2003/0045131 A1* | 3/2003 | Verbeke et al. .......... 438/795 |
| 2009/0211897 A1 | 8/2009 | Tsunekawa |
| 2009/0321246 A1 | 12/2009 | Tsunekawa et al. |
| 2010/0080894 A1 | 4/2010 | Tsunekawa et al. |
| 2010/0133092 A1 | 6/2010 | Mashimo et al. |
| 2010/0178528 A1 | 7/2010 | Tsunekawa et al. |
| 2010/0200394 A1 | 8/2010 | Nagamine et al. |
| 2010/0213047 A1 | 8/2010 | Nagamine et al. |
| 2010/0316890 A1 | 12/2010 | Choi et al. |
| 2011/0042209 A1 | 2/2011 | Yamaguchi et al. |

FOREIGN PATENT DOCUMENTS

| | | |
|---|---|---|
| JP | 10-326718 A | 12/1998 |
| JP | 11-026230 A | 1/1999 |
| JP | 2000-265263 A | 9/2000 |
| JP | 2002-053956 A | 2/2002 |
| JP | 2002-069631 A | 3/2002 |

OTHER PUBLICATIONS

Shimada, Y., et al., "Jisei Zairyo-Bussei, Kougaku-teki Tokusei to Sokutei Ho (Magnetic Materials-Properties, Engineering Charachteristics, and Measurement Method)", Kodansha Ltd., 1st Edition, pp. 364-366 (1999).

* cited by examiner

FIG. 6
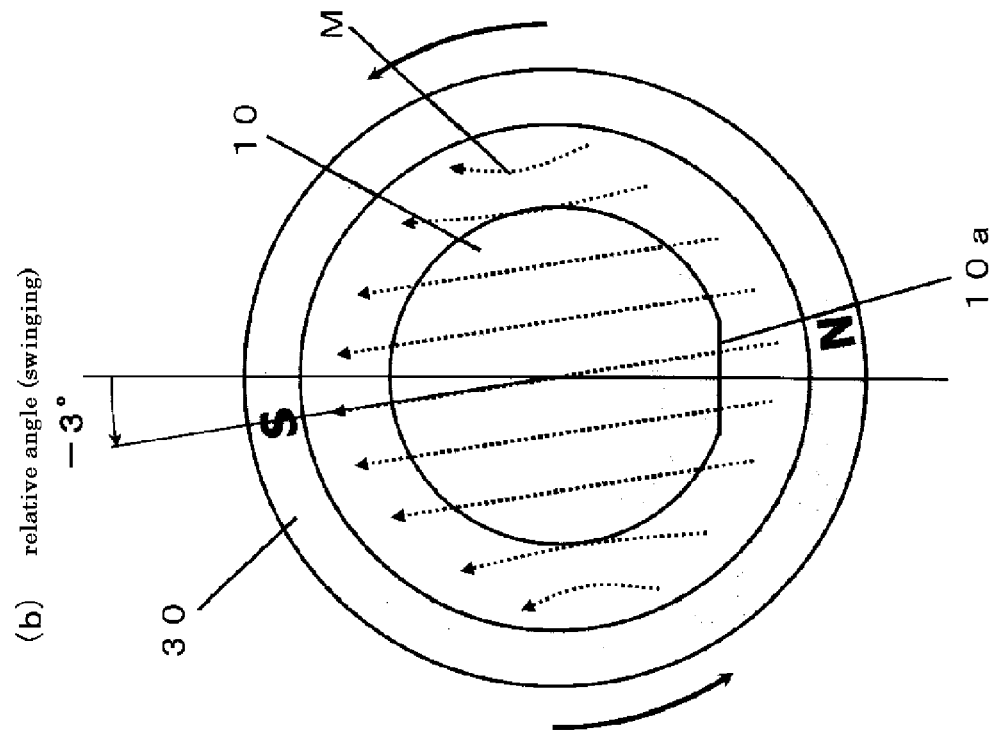
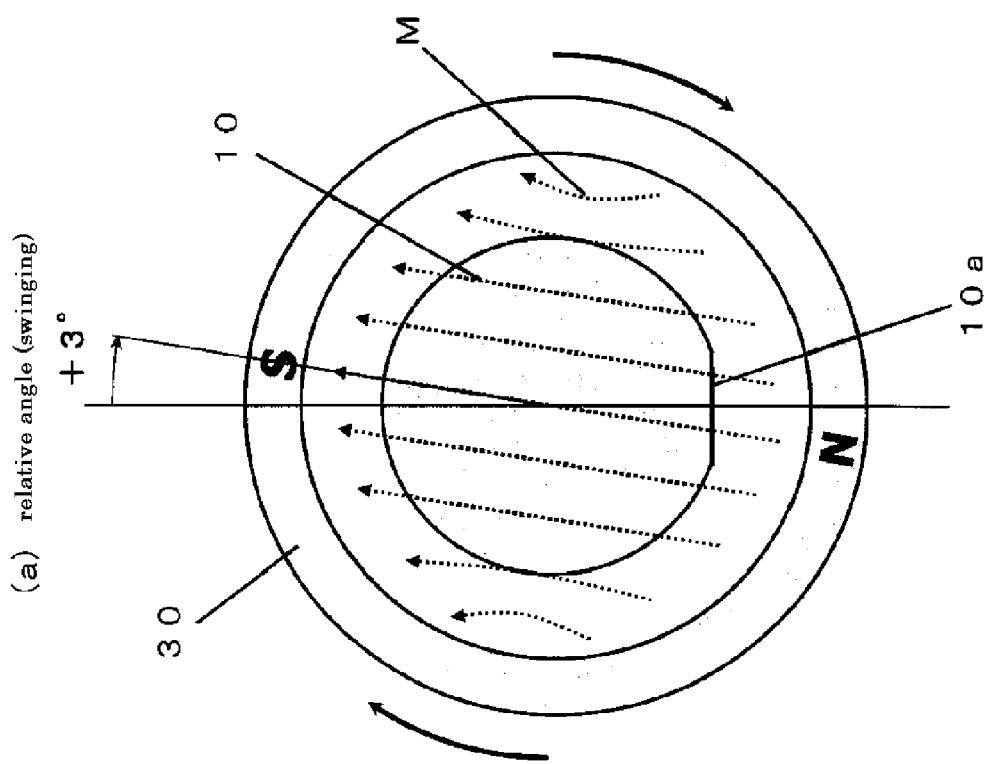

FIG. 11
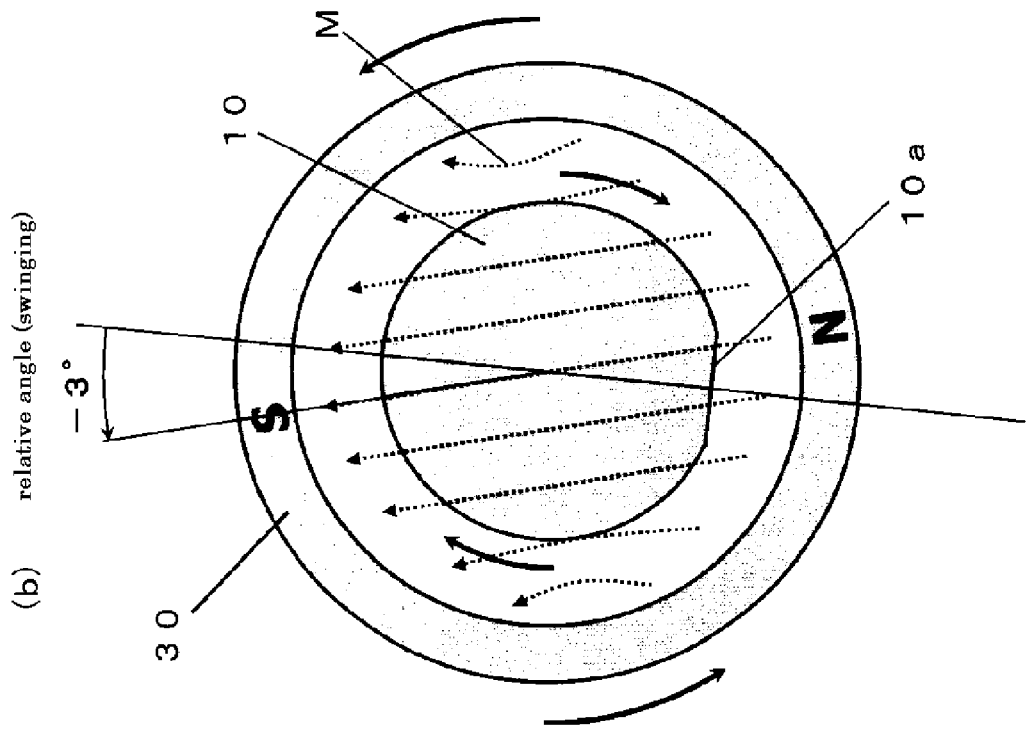
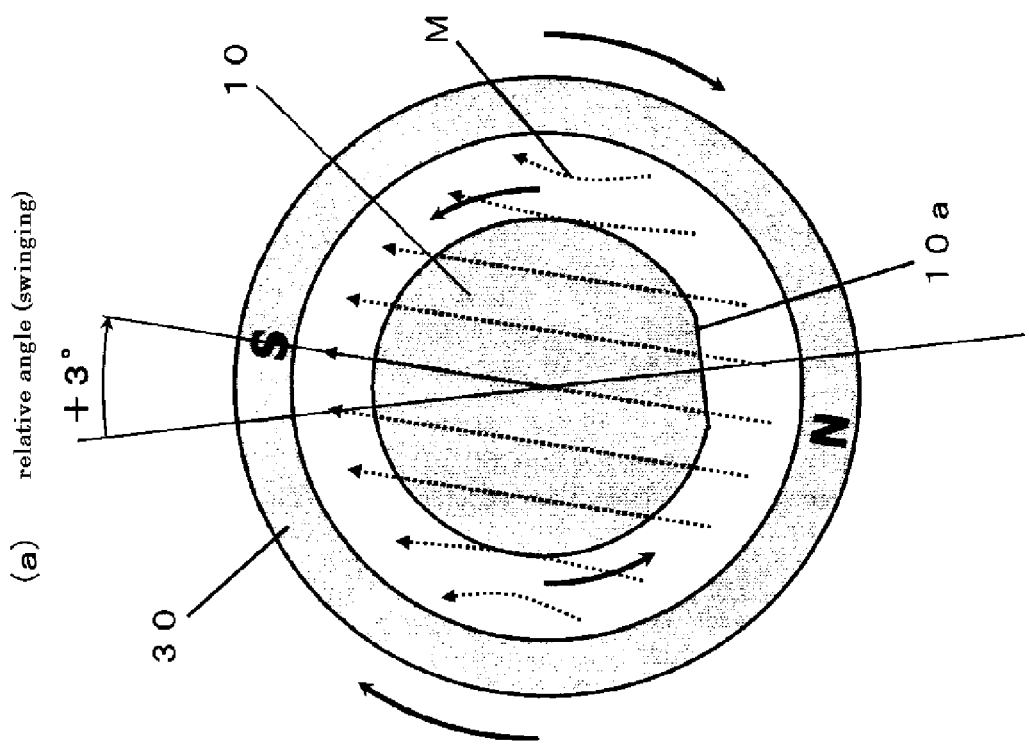

F I G. 1 6
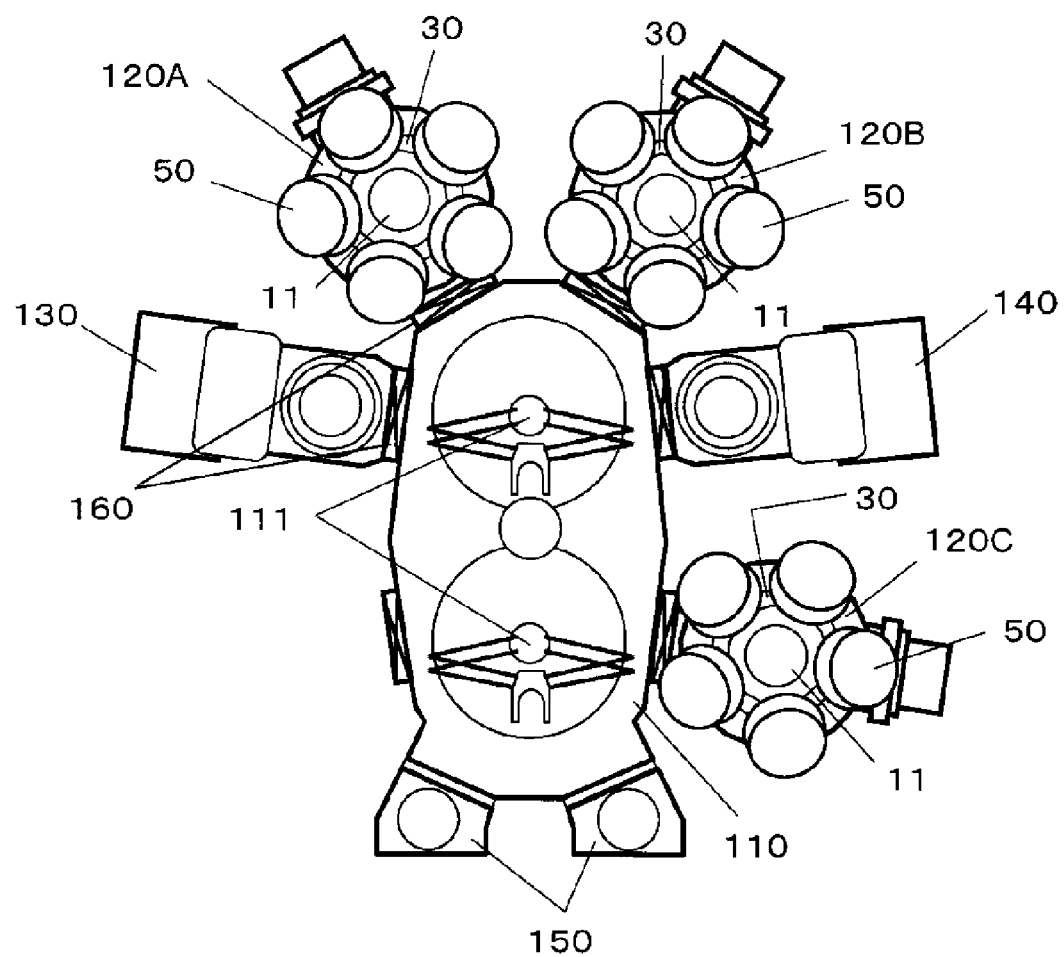

PLASMA PROCESSING APPARATUS, MAGNETORESISTIVE DEVICE MANUFACTURING APPARATUS, MAGNETIC THIN FILM FORMING METHOD, AND FILM FORMATION CONTROL PROGRAM

TECHNICAL FIELD

The present invention relates to a plasma processing apparatus that produces magnetic heads for magnetic disk drives, storage elements for magnetic random access memories, magnetic sensors, thin film inductors, and the like, and to a magnetoresistive device manufacturing apparatus, a magnetic thin film forming method, and a film formation control program.

BACKGROUND ART

Magnetic heads for magnetic disk drives, storage elements for magnetic random access memories (RAM), magnetic sensors, and thin film inductors each including a magnetic thin film or having a magnetic thin film contained in a multilayer thin film. Those magnetic thin films are required to have parallel axes of easy magnetization in one direction in the substrate plane.

As a technique for aligning axes of easy magnetization in one direction, an in-magnetic field film forming method is widely known. For example, two bar magnets are provided parallel to each other on either side of a substrate placed on a substrate holder, and a unidirectional magnetic field is applied to the substrate (see Patent Document 1). By this technique, however, the region in which the parallelism of magnetic force lines is maintained is extremely narrow. Therefore, this technique is not suitable for forming a magnetic thin film on a large diameter substrate.

To widen the region in which the parallelism of the magnetic force lines between the two bar magnets is maintained, ferromagnetic pole pieces are attached to the bar magnets (see Patent Document 2). According to another suggested technique, flat plate-like magnets, instead of bar magnets, are attached onto the bottom surface of the substrate (see Patent Document 3).

By each of the techniques disclosed in Patent Documents 1 through 3, however, the magnets are fixed onto a substrate supporting holder. Therefore, the direction of magnetic field application cannot be changed during film formation.

Particularly, in a spin-valve magnetic head utilizing a giant magnetoresistive effect, the relative angle between the axes of easy magnetization of the two magnetic layers of a pin layer and a free layer needs to be set at 90 degrees, and therefore, it is necessary to prepare a mechanism to change the direction of magnetic field application during film formation (see Non-Patent Document 1). To realize that, yet another technique has been suggested. According to this technique, an electromagnet including coil groups is used, and the direction and amount of current to be supplied to each of the coil groups are controlled. In this manner, perpendicular magnetic fields to each other are generated (see Patent Document 4).

In recent years, substrates have larger diameters than ever to obtain a large number of devices from each one substrate, as there is an increasing demand for devices. Also, uniformity in film thickness as well as parallelism of magnetic field is required. To achieve uniformity in film thickness, a film forming method by which each substrate is rotated is effective (see Patent Document 5). According to this rotating film forming method, a permanent magnet is used as a magnetic field applying unit. The permanent magnet is fixed onto a substrate holder, and constantly applies a unidirectional parallel magnetic field to the substrate.

In a case where there is a request for a change in the magnetic field orientation during film formation as described above, the rotating shaft of a substrate holder and the rotating shaft of a magnet supporting holder are provided independently of each other, and the rotations of the two rotating shafts are synchronized in each film forming operation. In this manner, a unidirectional magnetic field is applied to the substrate (see Patent Document 6). When the direction of magnetic field application is changed, the rotational phase is temporarily changed. After that, the synchronous rotation is continued, and the next magnetic thin film is formed in a magnetic field.

The measures to align the axes of easy magnetization of magnetic thin films in one direction are equivalent to the designing of a magnetic circuit to achieve parallelism of magnetic force lines in a large diameter substrate, and to the technique for constantly obtaining a uniform statistic magnetic field with respect to the substrate by synchronizing the rotations of the magnet and the substrate. As a magnetic circuit for applying a parallel magnetic field to a large diameter substrate, a device has been recently suggested. This device uses a Halbach dipole-ring magnet to form magnetic thin films (see Patent Document 7).

[Prior Art Documents]
[Patent Documents]
 [Patent Document 1] Japanese Laid-Open Patent Publication No. 5-339711
 [Patent Document 2] Japanese Laid-Open Patent Publication No. 10-326718
 [Patent Document 3] Japanese Laid-Open Patent Publication No. 10-245675
 [Patent Document 4] Japanese Laid-Open Patent Publication No. 11-26230
 [Patent Document 5] Japanese Laid-Open Patent Publication No. 2000-265263
 [Patent Document 6] Japanese Laid-Open Patent Publication No. 2002-53956
 [Patent Document 7] U.S. Pat. No. 6,743,340 B2
 [Non-Patent Document 1] "Gekkan Semiconductor World (Monthly Semiconductor World)", Koji TSUNEKAWA, 94 (April 1997)

DISCLOSURE OF THE INVENTION

Problems to be Solved by the Invention

By any of the conventional techniques, however, there is still a variation in axis of easy magnetization of a magnetic thin film formed on the substrate. Particularly, in the case of a substrate having a diameter larger than 6 inches, the variation in axis of easy magnetization becomes very large.

In view of the above circumstances, the present invention aims to provide a plasma processing apparatus, a magnetoresistive device manufacturing apparatus, a magnetic thin film forming method, and a film formation control program that are capable of reducing the variation in axis of easy magnetization of a magnetic thin film formed on a large diameter substrate.

Means to Solve the Problems

A plasma processing apparatus according to the present invention to achieve the above objective is a plasma processing apparatus that introduces a process gas into an evacuatable chamber, causes a plasma discharge between a cathode and a substrate holder by applying a discharge voltage to the cathode, and forms a thin film including a magnetic thin film on a process surface of the substrate by sputtering a target attached to the cathode. This plasma processing apparatus includes: a substrate holder that supports the substrate; a magnet holder that is provided around the substrate holder, and supports a magnet that forms a magnetic field on the process surface of the substrate; a cathode unit that is provided above the substrate holder, and has the discharge voltage applied thereto; a rotating mechanism that is capable of rotating one or both of the substrate holder and the magnet holder along the planar direction of the process surface of the substrate; a rotational position sensor that detects a rotating position or rotating positions of the substrate holder and/or the magnet holder; and a control device that controls an operation of each operation element accompanying a film forming process. The control device controls the rotating mechanism of the substrate holder and/or the magnet holder to swingingly vary a relative angle between an axis of easy magnetization set in the process surface of the substrate and the magnetic field generated by the magnet during formation of the magnetic thin film by sputtering, based on a detection signal from the rotational position sensor.

A thin-film device manufacturing apparatus according to the present invention includes: the plasma processing apparatus according to the present invention; an etching chamber that removes impurities from the process surface of the substrate; an oxidation chamber that oxidizes a metal thin film; and a load lock chamber that transports the substrate between a vacuum space and the atmosphere. The plasma processing apparatus, the etching chamber, the oxidation chamber, and the load lock chamber are connected via a vacuum transportation chamber including a vacuum transporting mechanism.

A magnetic thin film forming method according to the present invention is a method for forming a magnetic thin film on the process surface of a substrate by introducing a process gas into an evacuatable chamber, placing a magnet around the substrate, the magnet forming a magnetic field on the process surface of the substrate, applying a discharge voltage to a cathode to cause a plasma discharge between a substrate holder and the cathode, and sputtering a target attached to the cathode. This method characteristically includes swingingly varying the relative angle between the axis of easy magnetization set in the process surface of the substrate and the magnetic field generated by the magnet during formation of the magnetic thin film by sputtering.

A film formation control program according to the present invention is to be executed by a control device that controls rotation of a rotating mechanism of a substrate holder and/or a magnet holder, based on a detection signal from a rotational position sensor that detects the rotational position or rotational positions of the substrate holder supporting a substrate and/or the magnet holder supporting a magnet. This film formation control program causes the control device to: position the substrate and the magnet so that a magnetic field is formed in a direction perpendicular to a mark drawn on the substrate; swingingly vary the relative angle between the axis of easy magnetization set in the process surface of the substrate and the magnetic field generated by the magnet within the range of ±5 degrees at maximum during formation of a magnetic thin film by sputtering; swingingly vary the relative angle so that the relative angle becomes smaller as the film formation progresses; and forming the film by sputtering while the substrate and the magnet are rested in the positioned state.

Effects of the Invention

According to the present invention, the variation in axis of easy magnetization of a magnetic thin film formed on a large diameter substrate can be reduced.

BRIEF DESCRIPTION OF THE DRAWINGS

FIGS. 6A and 6B are plan views showing the positional relationship between the substrate and the magnet in Example 1;

FIGS. 11A and 11B are plan views showing the positional relationship between the substrate and the magnet in Example 3;

FIG. 16 is a plan view showing an example structure of an apparatus for manufacturing thin film devices.

BEST MODE FOR CARRYING OUT THE INVENTION

The following is a description of an embodiment of the present invention, with reference to the accompanying drawings. However, the present invention is not limited to this embodiment.

Figure 1:
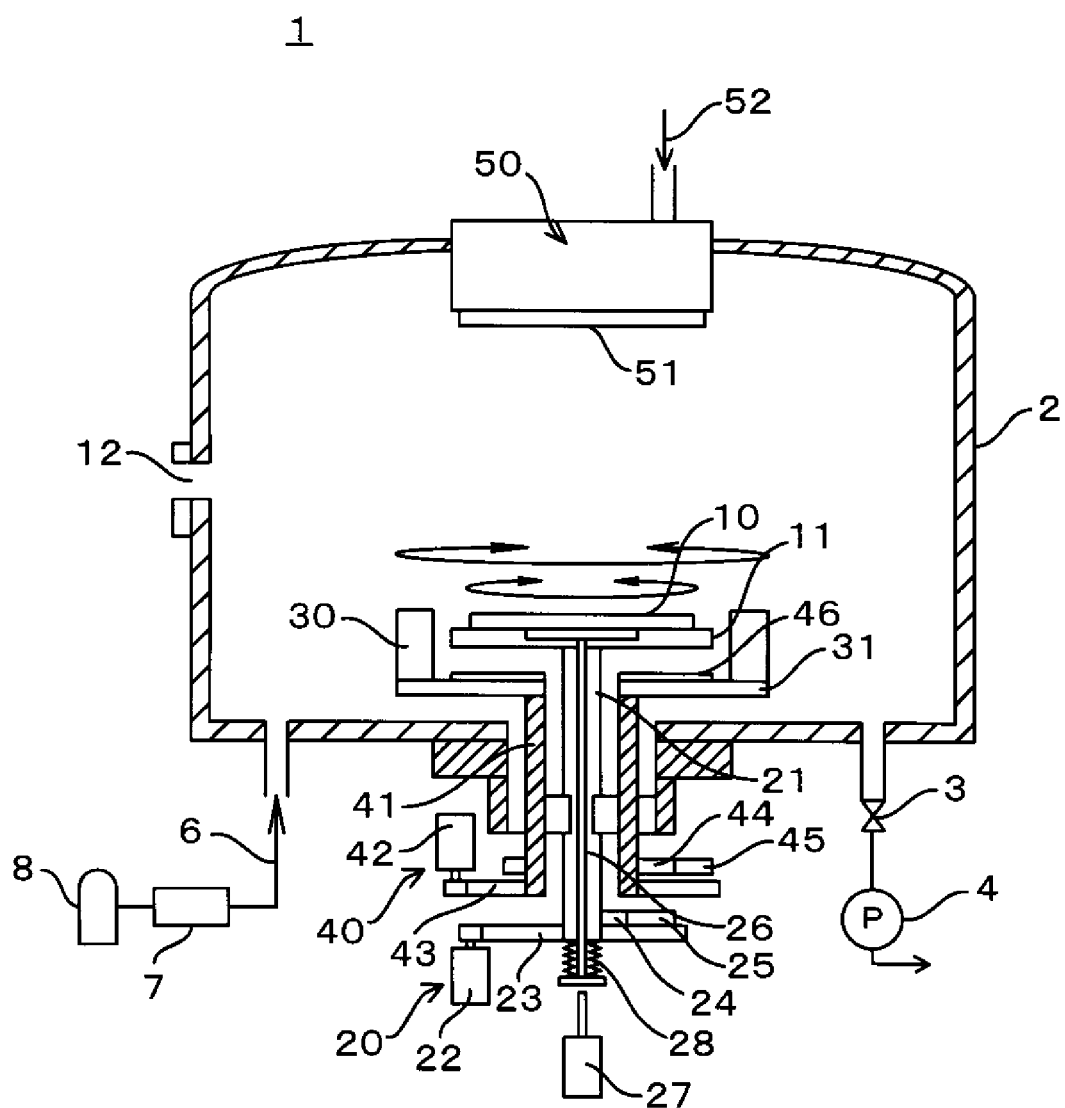
FIG. 1 is a schematic view showing an example structure of a plasma processing apparatus according to the present invention.
Figure 2:
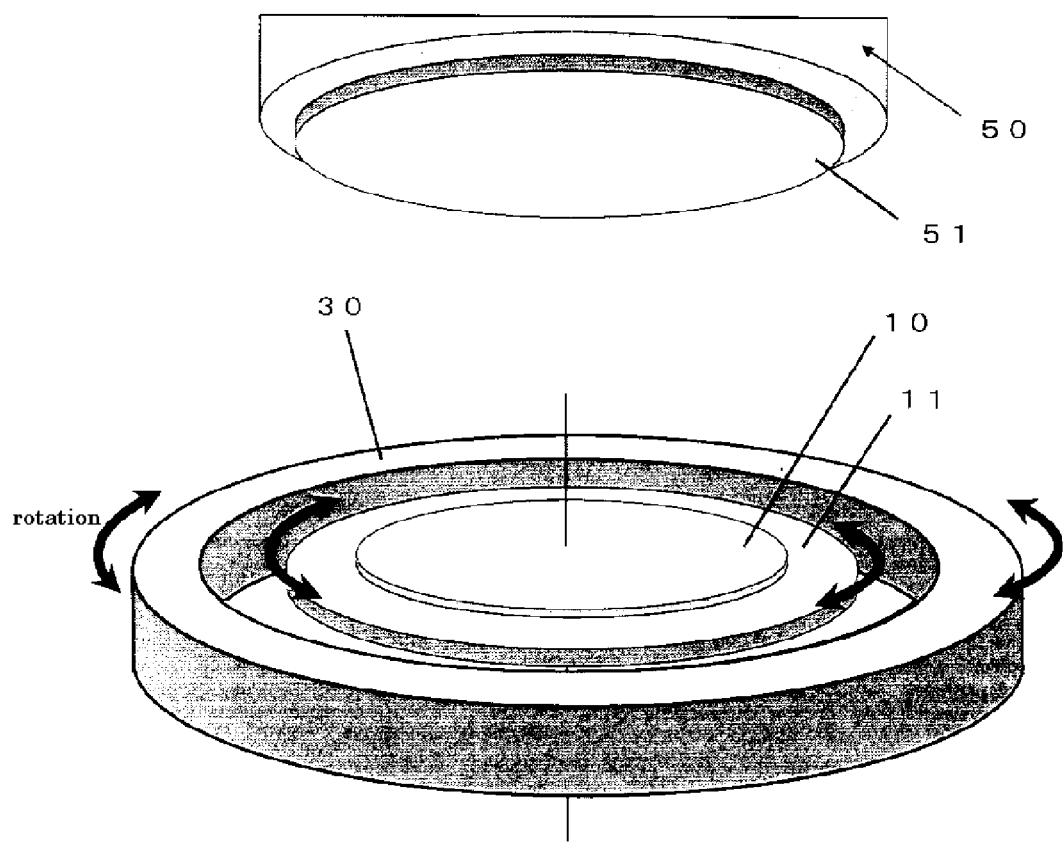
FIG. 2 is an explanatory view showing the positional relationship among a substrate, a magnet, and a cathode unit.
Figure 3:
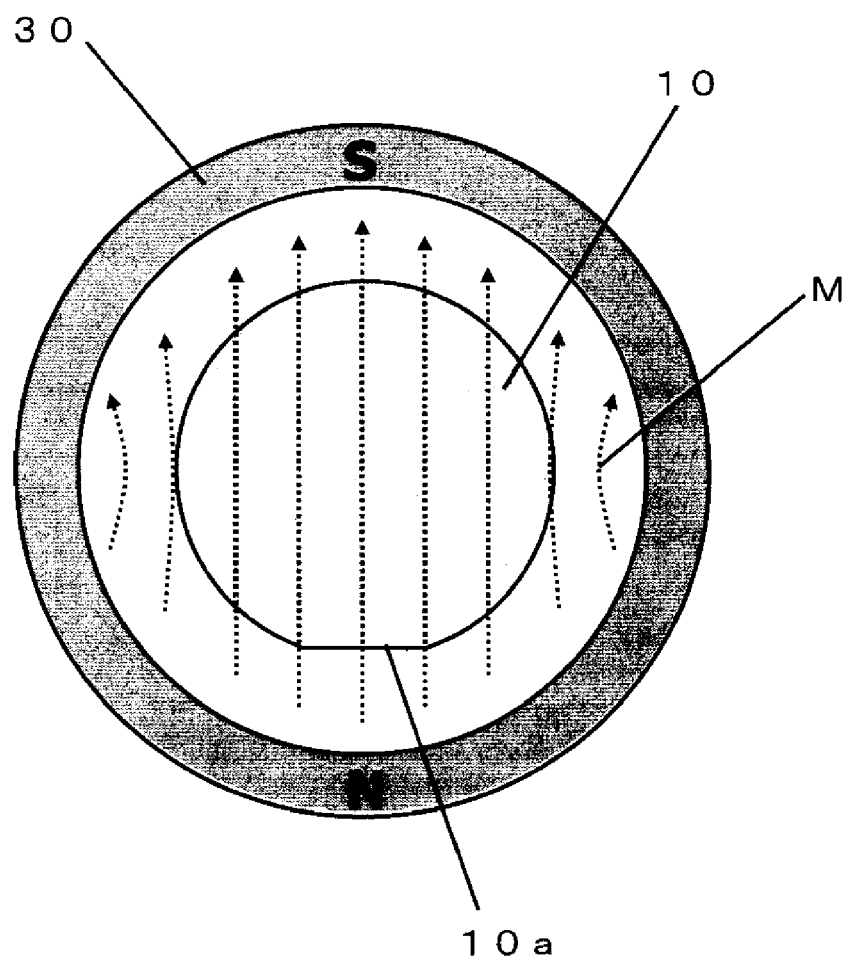
FIG. 3 is an explanatory view showing the magnetic field to be applied to the substrate by the magnet.

Referring to FIGS. 1 through 3, an embodiment of a plasma processing apparatus according to the present invention is described. FIG. 1 is a schematic view showing an example structure of the plasma processing apparatus according to the present invention. FIG. 2 is an explanatory view showing the positional relationships among a substrate, a magnet, and a cathode unit. FIG. 3 is an explanatory view showing the magnetic field applied to the substrate by the magnet.

As shown in FIGS. 1 and 2, the plasma processing apparatus 1 of this embodiment is a sputtering device that forms a thin film including a magnetic thin film on the process surface of the substrate. The plasma processing apparatus 1 includes a chamber (a reaction container) 2 that forms a compartment serving as a process space. An exhaust pump 4 serving as an exhaust system that can evacuate the inside of the chamber 2 to a desired degree of vacuum is connected to the chamber 2 via a main valve 3 such as a gate valve.

This chamber 2 has a gas inlet 5, and a process gas introduction system 6 that introduces a process gas such as a reactive gas into the chamber 2 is connected to the gas inlet 5. A gas bottle 8 is connected to the process gas introduction system 6 via an automatic flow rate controller 7, for example, and the process gas is introduced through the gas inlet 5 at a predetermined flow rate. Where sputtering is performed inside the chamber 2, the process gas introduction system 6 supplies the process gas into the chamber 2.

A substrate holder 11 that supports a substrate 10 on its upper face is provided at a lower portion of the process space inside the chamber 2. The substrate 10 to be processed is transported onto the substrate holder 11 by, for instance, a handling robot (not shown) through a horizontal slot 12. The substrate holder 11 is a disk-like stage, and supports the substrate 10 on its upper face by virtue of electrostatic absorption, for example. The substrate holder 11 is made of a conductive material, and also functions as an electrode that causes an electric discharge between the substrate holder 11 and the later described cathode. The substrate holder 11 is connected to a rotating mechanism 20 having a rotating shaft 21 that includes the center of the substrate 10 supported on the mounting surface of the substrate holder 11 and is perpendicular to the process surface of the substrate 10. The substrate holder 11 is designed to rotate about the shaft, so that the substrate 10 revolves on the process surface. The rotating mechanism 20 will be described later in detail.

The substrate (a wafer) 10 is held in a horizontal state on the mounting surface of the substrate holder 11. A disk-like silicon wafer (a $SiO_2$ substrate) is used as the substrate 10, but the substrate 10 is not limited to this. The substrate 10 has an orientation flat 10a or a notch as a mark for determining the axis of easy magnetization. For example, the polarity of a magnet 30 surrounding the substrate 10 is set so that the axis of easy magnetization is formed in a direction perpendicular to the orientation flat 10a.

A ring-like magnet holder 31 having an internal diameter larger than the external diameter of the substrate holder 11 is provided around the disk-like substrate holder 11. The ring-like substrate-side magnet 30 forming a magnetic field on the process surface of the substrate 10 is supported on the magnet holder 31. The magnet holder 31 includes a rotating mechanism 40 independent of the substrate holder 11. This rotating mechanism 40 will be described later, in detail.

As shown in FIG. 3, the magnet 30 forms a parallel magnetic field M along the process surface of the substrate 10. The magnetic field M is orientated in one direction in the process surface. The magnet 30 of this embodiment is preferably formed with a ring-like permanent magnet, for example, but is not necessarily a Halbach dipole-ring magnet. For example, two stick-like permanent magnets may be placed in parallel to each other, or arc-like permanent magnets may be combined to form a ring-like permanent magnet, so that the unidirectional magnetic field M is formed.

Referring back to FIG. 1, the rotating mechanism 20 of the substrate holder 11 and the rotating mechanism 40 of the magnet holder 31 are described. A rotating mechanism that can rotate one or both of the substrate holder 11 and the magnet holder 31 along the planar direction of the process surface of the substrate 10 is provided. As described above, this embodiment includes the rotating mechanism 20 of the substrate holder 11 and the rotating mechanism 40 of the magnet holder 31, and those rotating mechanisms are provided independently of each other. More specifically, the substrate holder 11 is fixed onto the rotating shaft 21, and is rotatingly driven by a drive unit 22 such as a motor via a gear mechanism 23. The magnet holder 31 is rotatingly driven by a drive unit 42 such as a motor via a rotating shaft 41 and a gear mechanism 43. Encoder magnetic rings 24 and 44 are attached to the respective rotating shafts 21 and 41, and encoder magnetism sensors 25 and 45 provided on the outer peripheral portions of the encoder magnetic rings 24 and 44 detect the orientation of the substrate 10, the orientation of the magnetic field, and the numbers of rotations. In other words, the encoder magnetism sensors 25 and 45 function as detectors that detect the rotational positions of the substrate holder 11 and the magnet holder 31.

A lift pin 26 is provided to penetrate through the insides of the substrate holder 11 and the rotating shaft 21. The lift pin 26 is moved up and down by a cylinder device 27 when the substrate is introduced and discharged, and transports the substrate 10 between the handling robot (not shown) and the substrate holder 11. A bellows 28 is provided at the lower end of the lift pin 26.

A concave-convex member 46 that has a large number of concavities and convexities arranged in the circumferential direction and functions as a shoe is provided on the upper face portion of the magnet holder 31 facing the bottom surface of the substrate holder 11. This concave-convex member 46 is brought into contact with the bottom surface of the substrate holder 11, so that the concave-convex member 46 and the substrate holder 11 can be rotated in unison. More specifically, the number of rotations of the substrate holder 11 is increased to a value close to the number of rotations of the magnet 30. When the orientations of the substrate 10 and the magnet 30 fall within a predetermined angle by virtue of an encoder output, the entire magnet rotating mechanism is lifted up by a drive mechanism, to bring the concave-convex member 46 into contact with the bottom surface of the substrate holder 11. Accordingly, the substrate 10 can be rotated while the orientations of the magnet 30 and the substrate 10 are maintained in a matching state within the predetermined angle.

A cathode unit 50 is placed above the substrate holder 11 in the process space. In this embodiment, the cathode unit 50 is positioned to face the substrate holder 11, but it is possible to position the cathode unit 50 in an offset manner by shifting the center of the cathode and the center of the substrate away from each other.

Although the substrate diameter and the target diameter are not particularly defined, uniform film formation can be performed even if the target diameter is smaller than the substrate diameter in a case where the substrate 10 positioned in an offset manner is rotated.

A magnetron (not shown) on which permanent magnets (cathode-side magnets) are arranged is provided on the back face side of the cathode in each cathode unit 50, and a magnetic field is formed on the surface side of a target 51, for example. The magnetron may be designed to form a magnet assembly on which permanent magnets are arranged in a matrix on the cathode back-face side, and form a cusp magnetic field on the target surface side.

The plate-like target 51 is attached onto the cathode surface side of the cathode unit 50. More specifically, the target 51 is provided closer to the process space than the cathode, and faces downward. The material of the target varies with the type of the film formed on the substrate 10. In the case of a magnetic thin film, the material of the target is the same as the material of the magnetic thin film or the magnetic material from which the magnetic thin film is formed. For example, the target 51 is a NiFe target, a CoFe target, or a CoFeB target.

A discharge power source (not shown) that applies a discharge voltage to the cathode is electrically connected to the cathode unit 50. The discharge power may be either high-frequency power or DC power.

A discharge gas introduction system 52 that supplies a process gas for discharging (a discharge gas) to the area surrounding the cathode is connected to the casing of the cathode unit 50. The discharge gas is an inert gas such as an Ar gas. The cathode causes a plasma discharge between the substrate holder 11 and the cathode, and is capable of sputtering the target 51 attached to the cathode unit 50.

Figure 4:
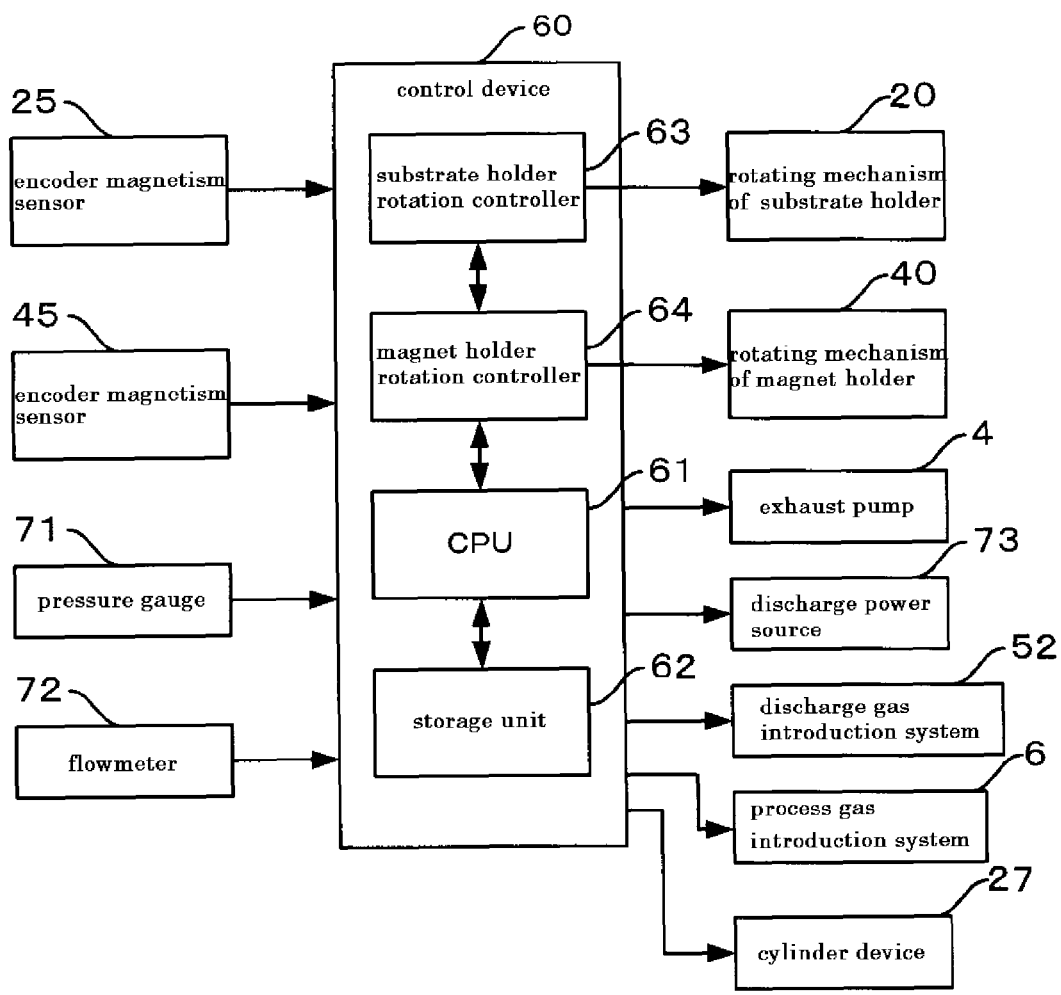
FIG. 4 is a block diagram showing a control device and its peripheral elements.

Referring now to FIG. 4, a control device 60 that is provided in the sputtering apparatus 1 of this embodiment and controls the respective operation elements accompanying a film forming process is described. FIG. 4 is a block diagram showing the control device and its peripheral elements according to this embodiment.

As shown in FIG. 4, the control device 60 of this embodiment is formed with a conventional personal computer (PC) that includes a CPU 61 and a storage unit 62 such as a ROM and a RAM, for example. The CPU 61 controls the above described components, and performs various arithmetic operations in accordance with programs. The storage unit 62 is formed with a ROM that stores various programs and parameters in advance, a RAM that serves as a work area and temporarily stores programs and data, and the like.

More specifically, the control device 60 outputs control commands to a discharge power source 73, the discharge gas introduction system 52, the exhaust pump 4, the process gas introduction system 6, the rotating mechanism 20 of the substrate holder 11, the rotating mechanism 40 of the magnet holder 31, the cylinder device 27, and the like. In compliance with the commands, various process conditions such as the discharge time, the discharge power, and the process pressure are controlled. The control device 60 is also capable of acquiring output values of various sensors such as a pressure gauge 71 that measures the pressure inside the chamber 2, a flow-meter 72 that measures gas flow rates, and the encoder magnetism sensors 25 and 45 that detect the rotational position of the substrate 10. Accordingly, the control device 60 is capable of performing control in accordance with the state of the apparatus.

Particularly, this control device 60 includes a substrate holder rotation controller 63 and a magnet holder rotation controller 64. The substrate holder rotation controller 63 adjusts the direction and speed of rotation of the substrate holder 11 in accordance with the rotational position detected by the encoder magnetism sensor 25. The magnet holder rotation controller 64 adjusts the direction and speed of rotation of the magnet holder 31 in accordance with the rotational position detected by the encoder magnetism sensor 45.

Next, a magnetic thin film forming method according to the present invention to be implemented with the use of the plasma processing apparatus 1 of this embodiment, as well as the effects of this apparatus 1, are described. The algorithm for the magnetic thin film forming method according to the present invention is stored as a film formation control program in the storage unit 62 of the control device 60, and is read and executed by the CPU 61 when an operation is started.

Here, the film formation control program is a program to be executed by the control device to perform the rotation control on the rotating mechanisms 20 and 40, based on detection signals from the rotational position sensors 25 and 45 detecting the rotational position(s) of the substrate holder 11 and/or the magnet holder 31. More specifically, the film formation control program includes the first step of positioning the substrate 10 and the magnet 30 so that a magnetic field is formed in a direction perpendicular to the mark (the orientation flat) 10a of the substrate 10. The film formation control program also includes the second step of swingingly varying the relative angle between the axis of easy magnetization set in the process surface of the substrate 10 and the magnetic field generated by the magnet 30 within the range of ±5 degrees at maximum during the formation of the magnetic thin film by sputtering. The film formation control method further includes the third step of swingingly varying the relative angle so that the relative angle becomes gradually smaller as the film formation progresses. The film formation control program also includes the fourth step of forming the remaining portion of the film by sputtering while the substrate 10 and the magnet 30 are rested in the positioned state.

The film formation control program is recorded on a PC-readable recording medium, and is installed in the storage unit 62 of the PC. Examples of recording media include magnetic recording media such as floppy (a registered trade name) disks and ZIP (a registered trade name), magneto-optical media such as MO, and optical disks such as CD-R, DVD-R, DVD+R, CD-R, DVD-RAM, DVD+RW (a registered trade name), and an optical disk such as PD. Other examples include flash memories such as compact flash (a registered trade name), SmartMedia (a registered trade name), memory sticks (a registered trade name), multimedia cards, and SD memory cards, and removable hard disks such as microdrives (a registered trade name) and Jaz (a registered trade name).

By the magnetic thin film forming method according to the present invention, the substrate (a wafer) 10 to be processed is placed on the substrate holder 11. The substrate 10 is transferred onto the substrate holder 11 with the use of the handling robot (not shown) through the horizontal slot 12, for example. If necessary, a substrate bias is applied from a power supply (not shown) to the substrate holder 11.

The inside of the chamber 2 is then evacuated to a predetermined degree of vacuum by an exhaust system. A discharge gas such as an Ar gas is then introduced from the discharge gas introduction system 52 into the chamber 2. Where reactive sputtering is performed, a reactive gas is introduced from the process gas introduction system 6 into the chamber 2.

The target 51 of the material from which a film is to be formed on the process surface of the substrate 10 is attached to the cathode unit 50. The material of the target 51 of this embodiment is the same as the material of the magnetic thin film to be formed on the substrate 10 or the material from which the magnetic thin film is to be formed. For example, the target 51 is a NiFe target, a CoFe target, or a CoFeB target.

In this embodiment, the substrate 10 and the target 51 are positioned to face each other. Therefore, the target 51 has a disk-like shape, and is designed to have a larger diameter than the substrate diameter.

The cathode unit 50 and the target 51 may be arranged in an offset manner by slanting them and placing them obliquely above the substrate 10. Where the substrate 10 in the offset arrangement is rotated, a uniform film can be formed, though the diameter of the target is smaller than the diameter of the substrate. The angle of inclination of the target 51 is not particularly limited by the present invention, but it is preferable to position the cathode unit 50 so that the angle θ of the cathode center axis with respect to the normal line of the process surface of the substrate 10 becomes greater than 0° but 45° or less.

Where the substrate holder 11 and the magnet holder 31 are in a resting state, the substrate 10 having the axis of easy magnetization in a direction perpendicular to the orientation flat 10a thereof and the magnet 30 are positioned so as to form the magnetic field M orientated in one direction in the process surface of the substrate 10.

In this situation, an Ar gas is introduced from the discharge gas introduction system 52 until the pressure inside the chamber 2 reaches a predetermined pressure. After the gas pressure is stabilized, a magnetic field is formed on the target surface of the cathode unit 50, and a discharge power is supplied from a power supply (not shown). In this manner, a plasma discharge is caused between the cathode unit 50 and the substrate holder 11, and the target material is sputtered onto the substrate, to form a thin film.

In the initial stage of film formation (simultaneously with the start of film formation), the largest relative angle between the axis of easy magnetization set in the process surface of the substrate 10 and the magnetic field generated by the magnet 30 is varied in a swinging manner within the range of ±5 degrees. The relative angle is then controlled to become smaller as the deflection angle becomes gradually smaller in the course of film formation. For example, in a process to form a film of 20 nm in thickness, the relative angle is controlled so that the swinging ends at the point when the film thickness becomes 10 nm, and the remaining 10 nm of the film is formed while the orientation flat 10a and the magnetic field orientation are held in a vertical state (see FIG. 7, which will be described later).

During the discharge of the cathode unit 50, the rotational position sensors 25 and 45 detect the rotational positions of the substrate 10 and the magnet 30, and, in accordance with the detected rotational positions, adjust the rotation speed(s) of the substrate holder 11 and/or the magnet holder 31.

When the film formation is completed, the lift pin 26 is lifted up by the cylinder device 27, and the horizontal slot 12 is opened to transport the substrate 10 between the handling robot (not shown) and the substrate holder 11.

As described above, according to the film forming method of this embodiment, the relative angle between the substrate holder 11 and the magnet holder 31 is varied in a swinging manner, so that the axes of easy magnetization of magnetic thin films becomes substantially parallel to one another. Accordingly, the variation becomes smaller.

If the largest relative angle between an axis of easy magnetization and a magnetic field exceeds ±5 degrees, the effect to reduce the variation becomes remarkably small. Therefore, the largest relative angle should preferably be within the range of ±5 degrees.

Further, the control performed to reduce the deflection angle in the course of the film formation of a magnetic thin film has the effect to gradually reduce the variation. Therefore, the control operation is preferable in obtaining magnetic thin films having more parallel axes of easy magnetization, but the present invention is not limited to this.

EXAMPLES

In the following, the present invention is described in greater detail by way of examples. However, the present invention is not limited to those examples.

Example 1

Figure 5:
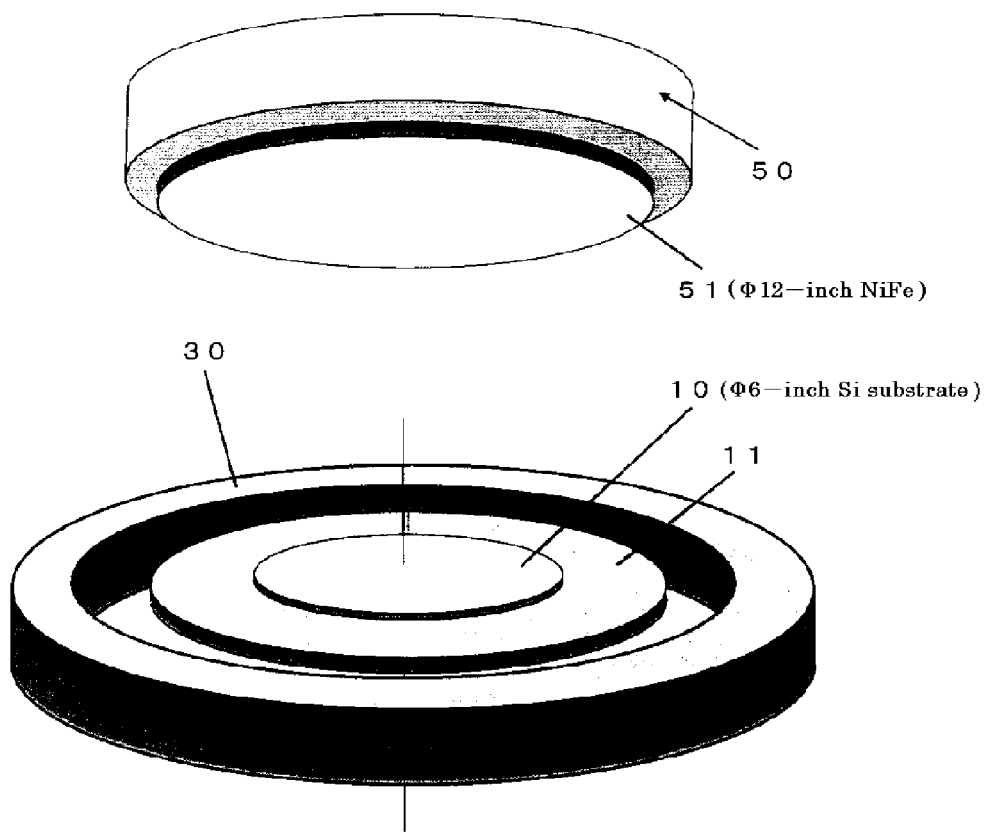
FIG. 5 is a schematic view illustrating a magnetic thin film forming method of Example 1.
Figure 7:
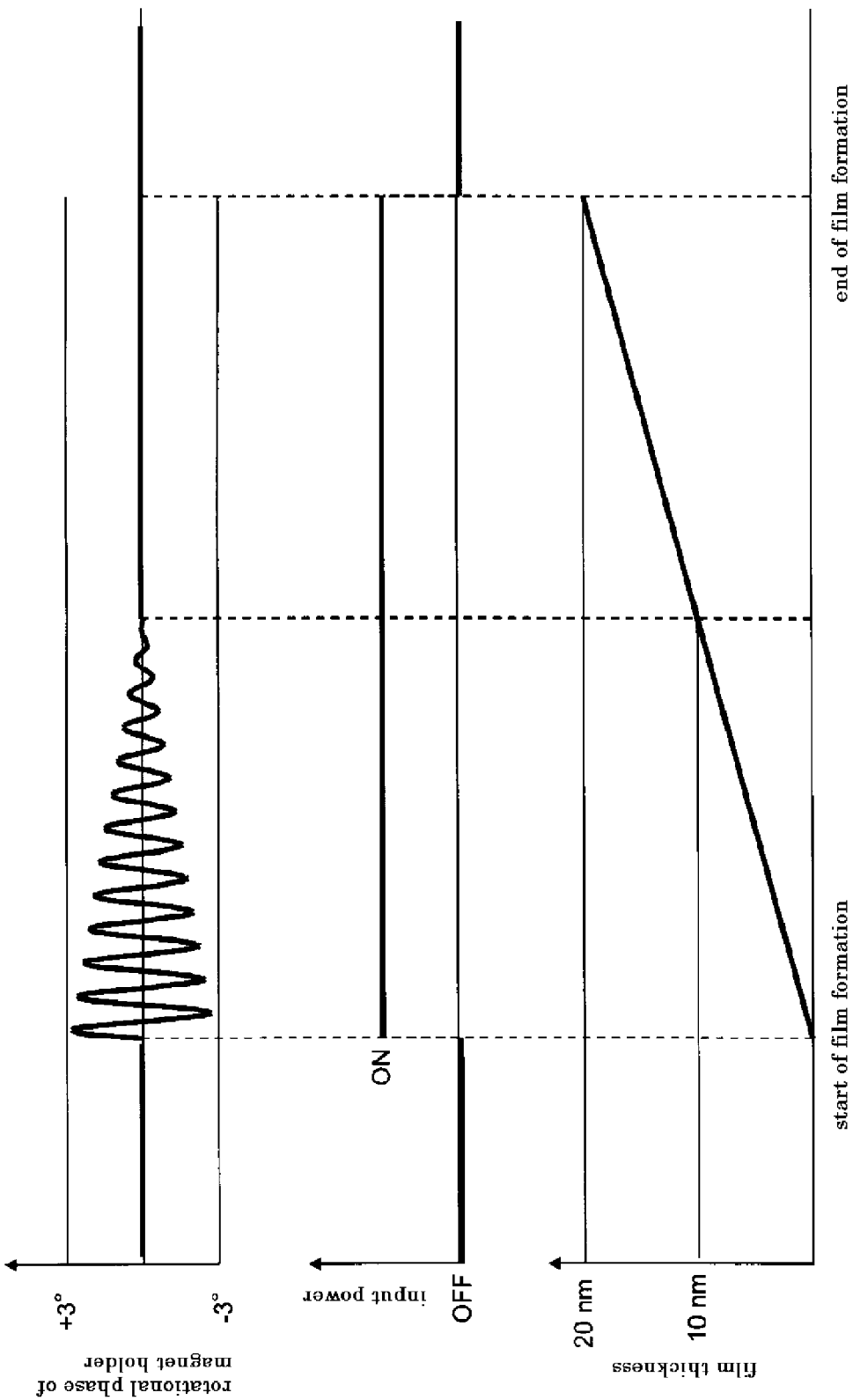
FIG. 7 is a timing chart illustrating operations in Example 1.

FIG. 5 is a schematic view illustrating a magnetic thin film forming method of Example 1. FIGS. 6A and 6B are plan views showing the positional relationship between the substrate and the magnet in Example 1. FIG. 7 is a timing chart illustrating operations in Example 1.

In Example 1, a magnetic thin film of NiFe (nickel iron) having an axis of easy magnetization in a direction perpendicular to an orientation flat 10a is formed on a Si wafer 10 that is 6 inches in diameter and has the orientation flat 10a, as shown in FIG. 5.

A target 51 is 12 inches in diameter and is made of NiFe. The substrate 10 and the target 51 are positioned to face each other in a parallel state. The distance between the substrate 10 and the target 51 is 430 mm.

While the substrate holder 11 and the magnet holder 31 are in a resting state, the substrate 10 and the magnet 30 are positioned so as to apply a magnetic field M in the direction perpendicular to the orientation flat 10a. In this manner, the desired axis of easy magnetization is formed in the direction perpendicular to the orientation flat 10a of the substrate 10. The parallelism of the magnetic field M formed by the magnet 30 is ±1 degree in the plane of 6 inches in diameter, and the magnetic field intensity is 7958 A/m (100 Oe (oersteds)) at the center of the substrate where the magnetic field is weakest.

An Ar gas is introduced until the pressure inside the chamber becomes 0.03 Pa. After the gas pressure is stabilized, a DC power of 4 kW is supplied to the cathode to start film formation. As shown in FIGS. 6A and 6B, the magnet holder 31 is swung at a deflection angle (a relative angle) of ±3 degrees at the same time as the start of the film formation. A control operation is performed so that the deflection angle becomes smaller as the film formation progresses. More specifically, in a process to form a thin film of 20 nm in thickness, the swinging is stopped when the film thickness becomes 10 nm, and the remaining 10 nm of the film is formed while the orientation flat 10a and the magnetic field orientation are held in a vertical state. This situation is illustrated in the timing chart of FIG. 7.

Figure 8:
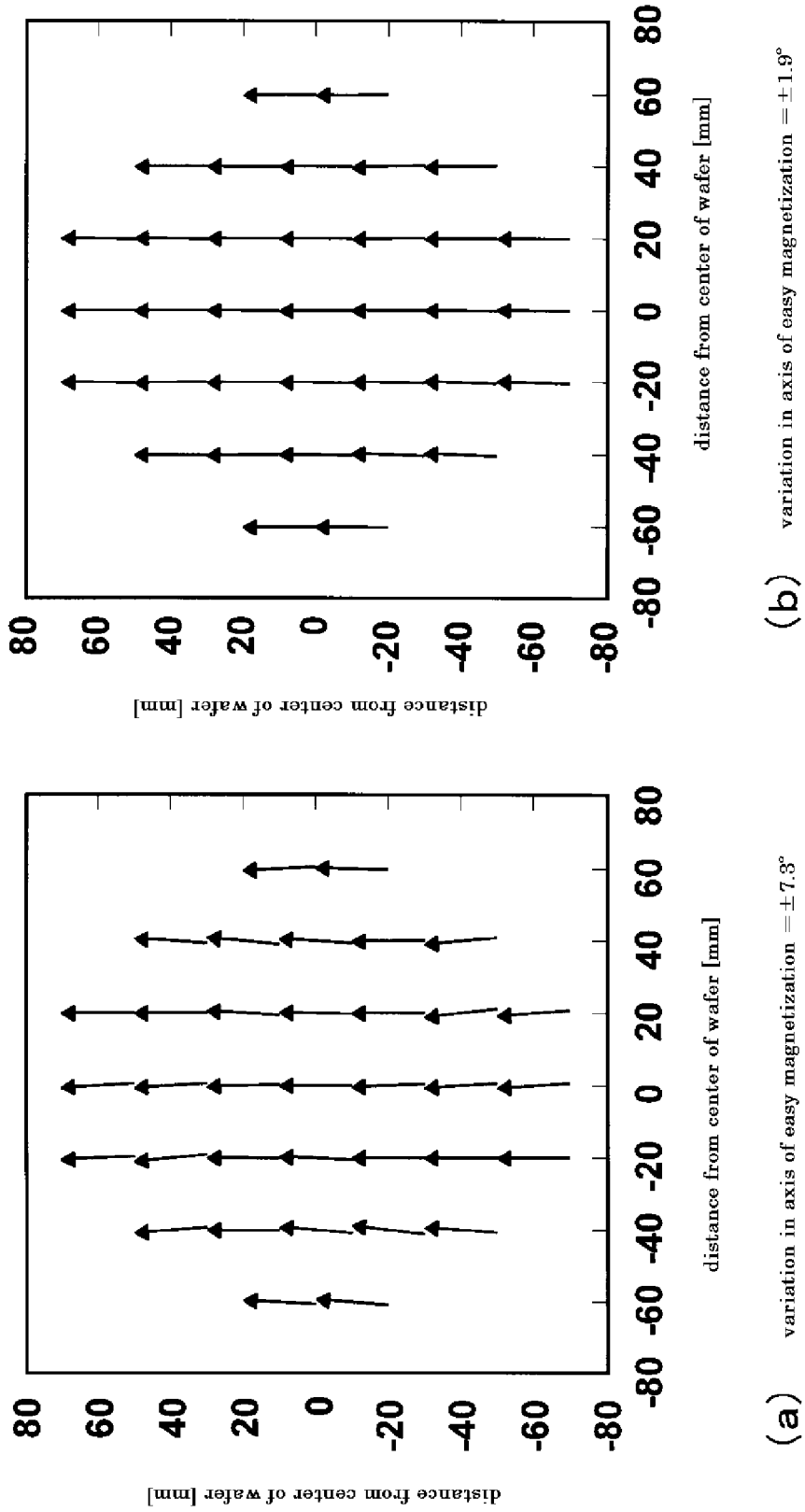
FIGS. 8A and 8B show distribution charts indicating the results of measurement carried out on the orientations of axes of easy magnetization of magnetic thin films, FIG. 8A showing the results of measurement by a conventional technique, and FIG. 8B showing the results of measurement by the method according to the present invention.

FIGS. 8A and 8B show distribution charts indicating the results of measurement carried out on the orientations of axes of easy magnetization of magnetic thin films. FIG. 8A shows the results of measurement by a conventional technique. FIG. 8B shows the results of measurement by the method according to the present invention. In FIGS. 8A and 8B, the orientations of the axes of easy magnetization of NiFe films are measured at 35 points in the process surface of each substrate by taking advantage of the magnetic Kerr effect. A method for measuring magnetization directions by virtue of the Kerr effect is disclosed in "Jisei Zairyo-Bussei, Kougaku-teki Tokusei to Sokutei Ho (Magnetic Materials —Properties, Engineering Characteristics, and Measurement Method)" (Yutaka SHIMADA, Koji YAMADA, Shinichiro HATTA, and Hirotoshi FUKUNAGA, 1st Edition, p.p. 364-366, Kodansha Ltd. Jun. 20, 1999), for example.

By the conventional technique shown in FIG. 8A, the variation in axis of easy magnetization is ±7.3 degrees. By the method according to the present invention shown in FIG. 8B, on the other hand, the variation in axis of easy magnetization is ±1.9 degrees. As can be seen from FIG. 8B, the variation in axis of easy magnetization in the formed film on a large substrate of 6 inches in diameter is reduced.

Example 2

Figure 9:
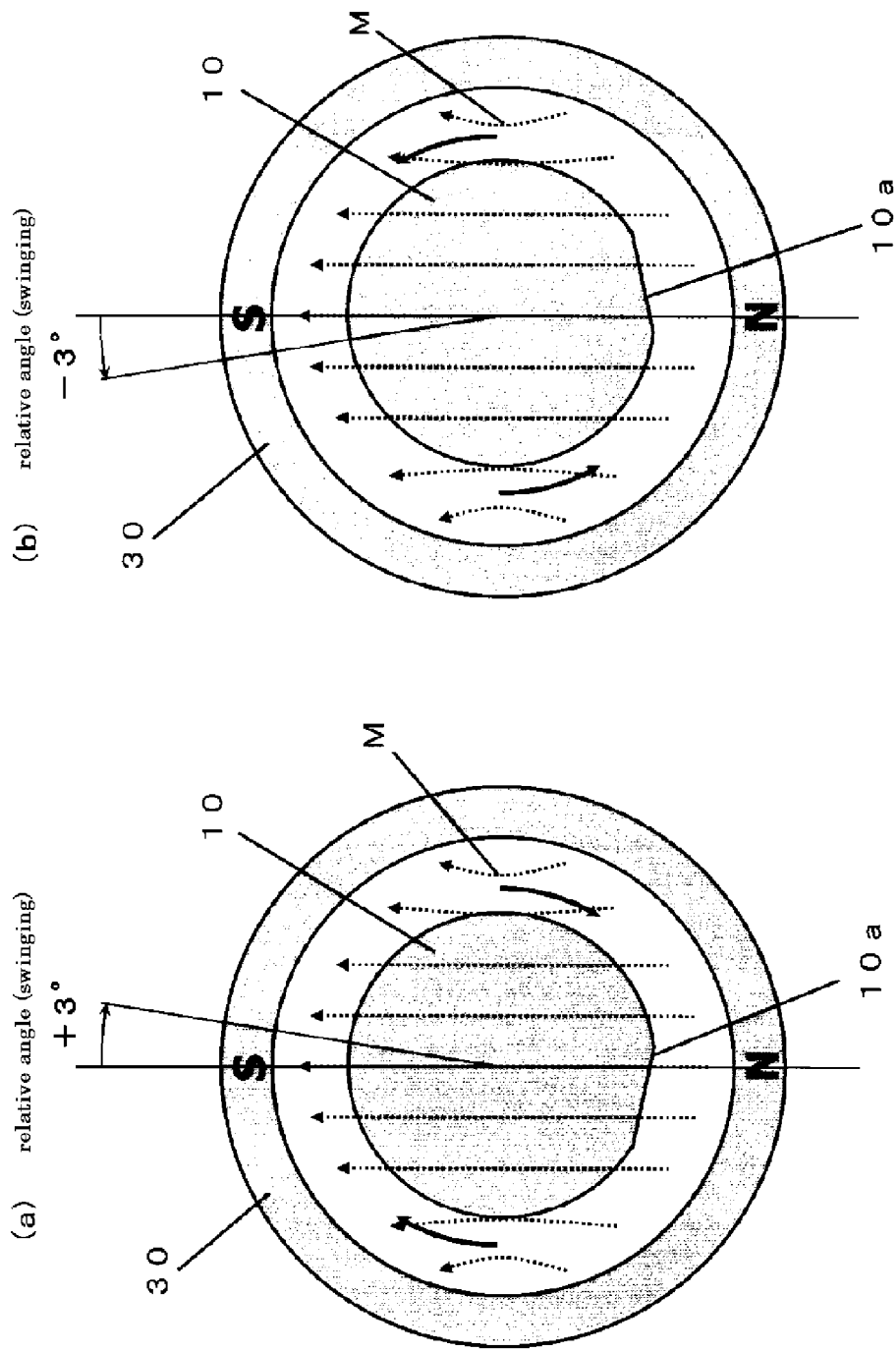
FIGS. 9A and 9B are plan views showing the positional relationship between the substrate and the magnet in Example 2.
Figure 10:
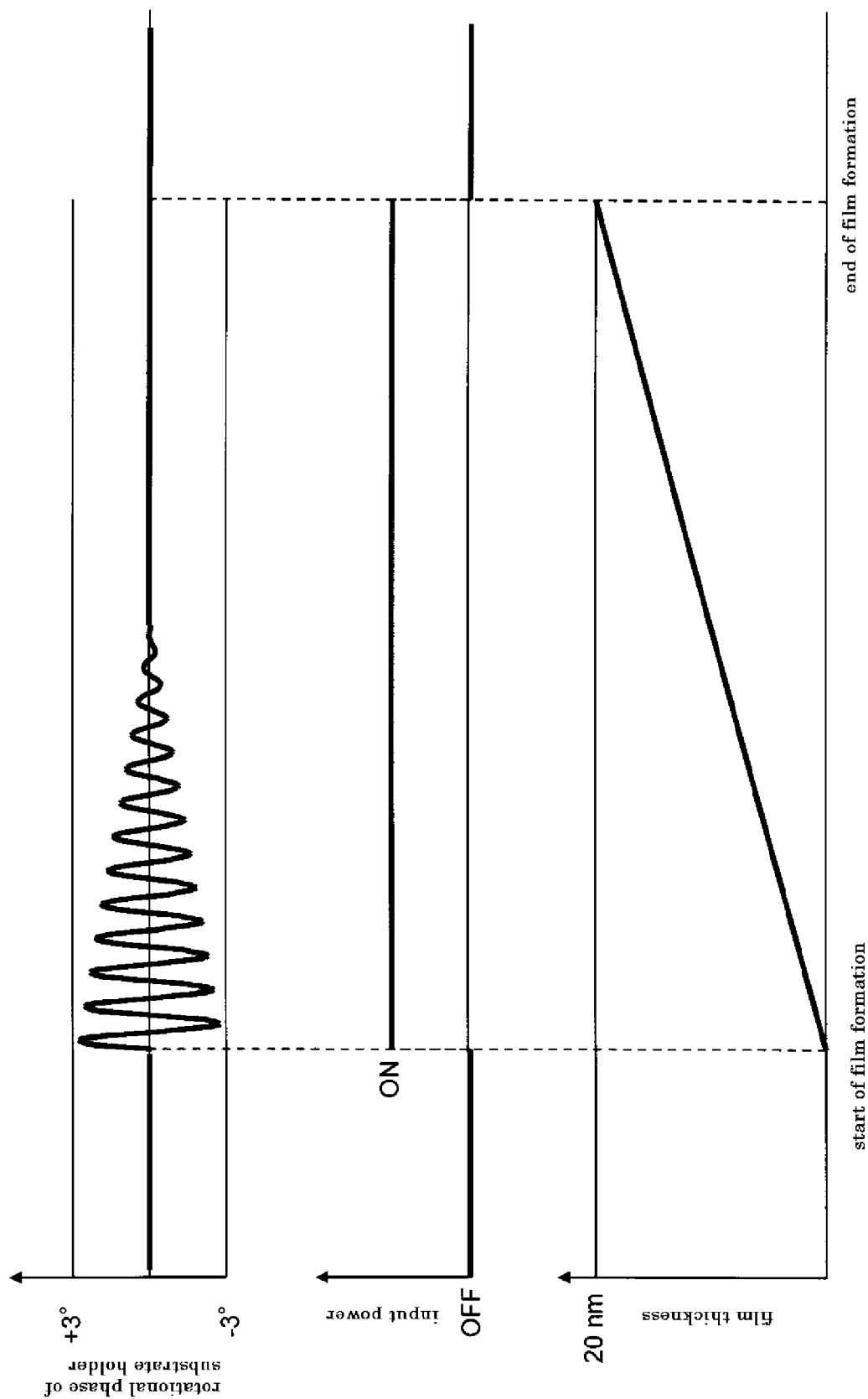
FIG. 10 is a timing chart illustrating operations in Example 2.

FIGS. 9A and 9B are plan views showing the positional relationship between the substrate and the magnet in Example 2. FIG. 10 is a timing chart illustrating operations in Example 2.

As shown in FIGS. 9A and 9B, in Example 2, the magnet holder 31 are put into a resting state, and only the substrate holder 11 is swung. As in Example 1, in a process to form a thin film of 20 nm in thickness, a control operation is performed so that the swinging is stopped when the film thickness becomes 10 nm, and the remaining 10 nm of the film is formed while the orientation flat 10a and the magnetic field orientation are held in a vertical state. This situation is illustrated in the timing chart of FIG. 10. Through such an operation, the variation in axis of easy magnetization can be reduced as in Example 1.

Example 3

Figure 12:
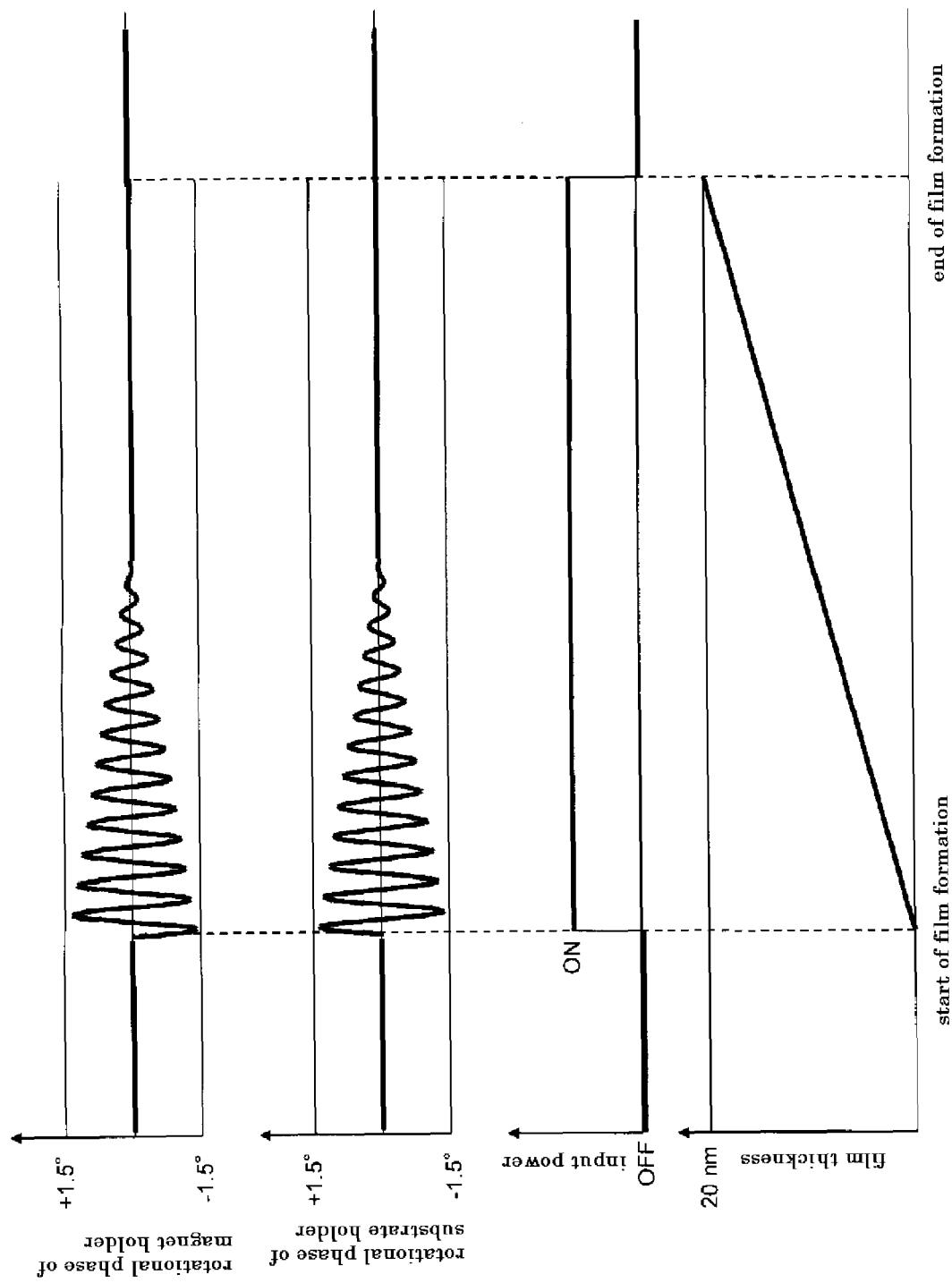
FIG. 12 is a timing chart illustrating operations in Example 3.

FIGS. 11A and 11B are plan views showing the positional relationship between the substrate and the magnet in Example 3. FIG. 12 is a timing chart illustrating operations in Example 3.

As shown in FIGS. 11A and 11B, in Example 3, the substrate holder 11 and the magnet holder 31 are swung in opposite directions from each other. As in Example 1, in a process to form a thin film of 20 nm in thickness, a control operation is performed so that the swinging is stopped when the film thickness becomes 10 nm, and the remaining 10 nm of the film is formed while the orientation flat 10a and the magnetic field orientation are held in a vertical state. This situation is illustrated in the timing chart of FIG. 12. Through such an operation, the variation in axis of easy magnetization can be reduced as in Example 1.

Example 4

Figure 13:
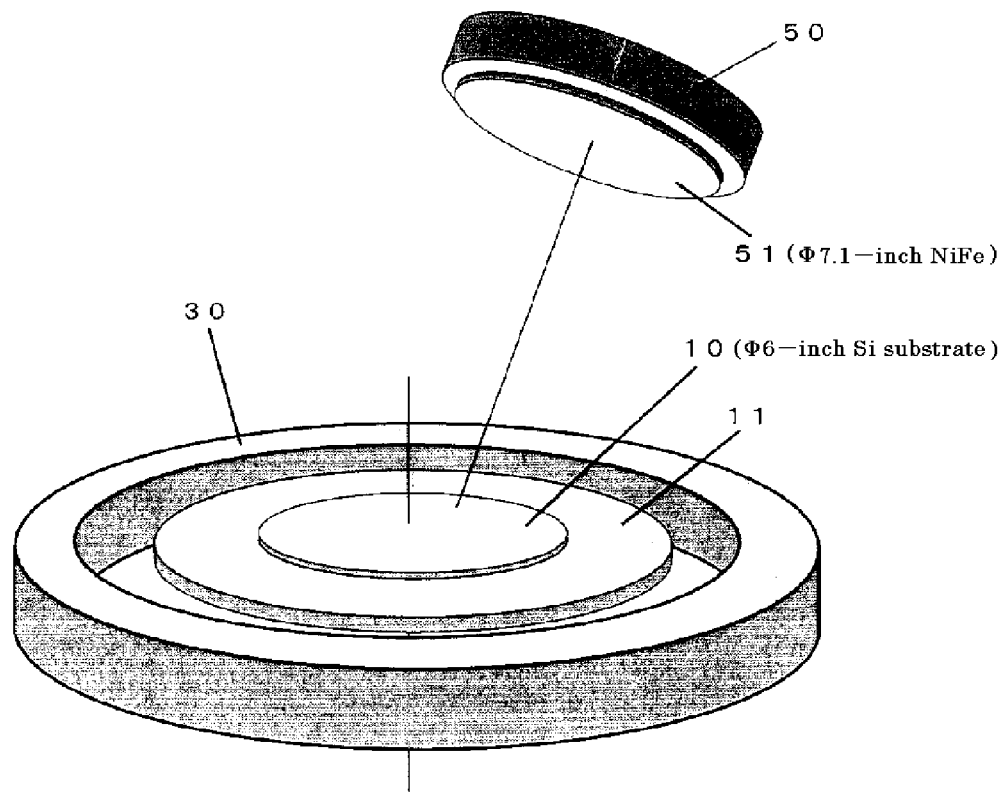
FIG. 13 is an explanatory view illustrating a magnetic thin film forming method of Example 4.
Figure 14:
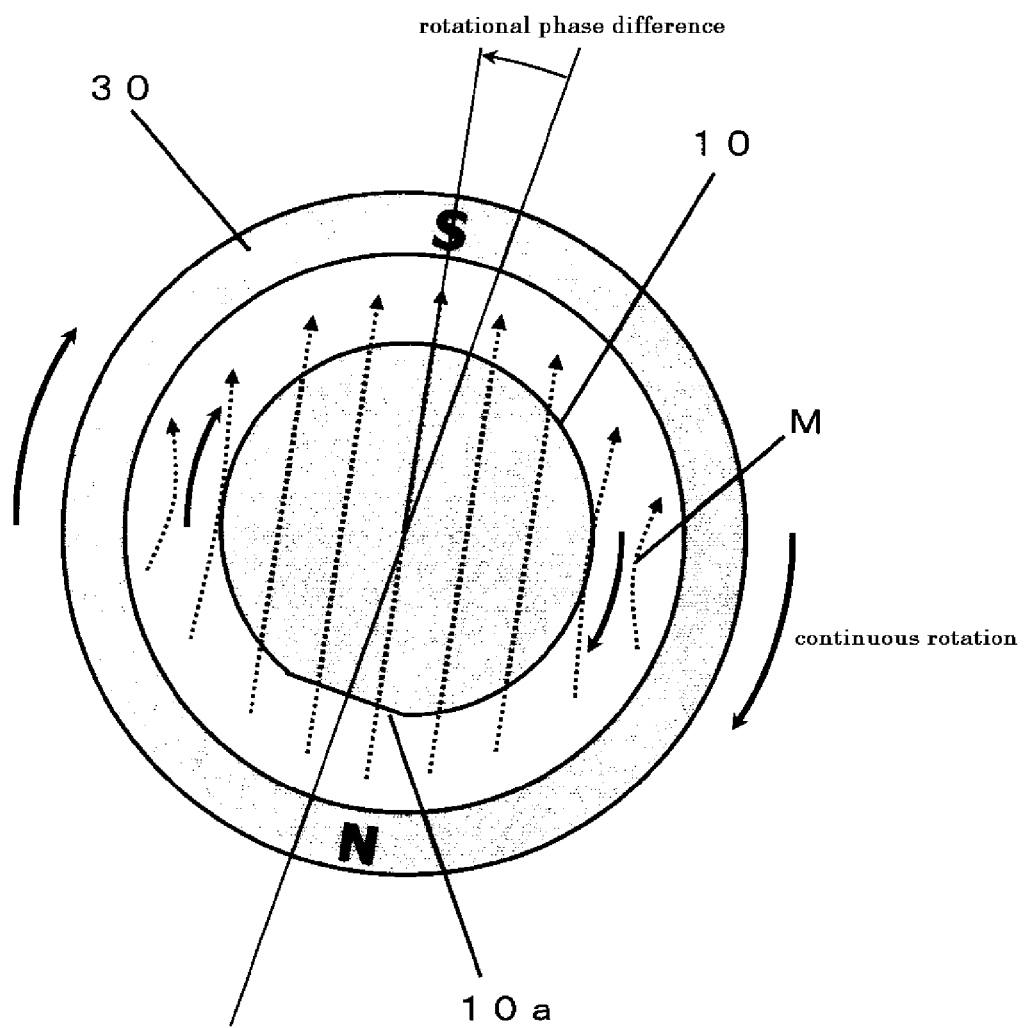
FIG. 14 is a plan view showing the positional relationship between the substrate and the magnet in Example 4.
Figure 15:
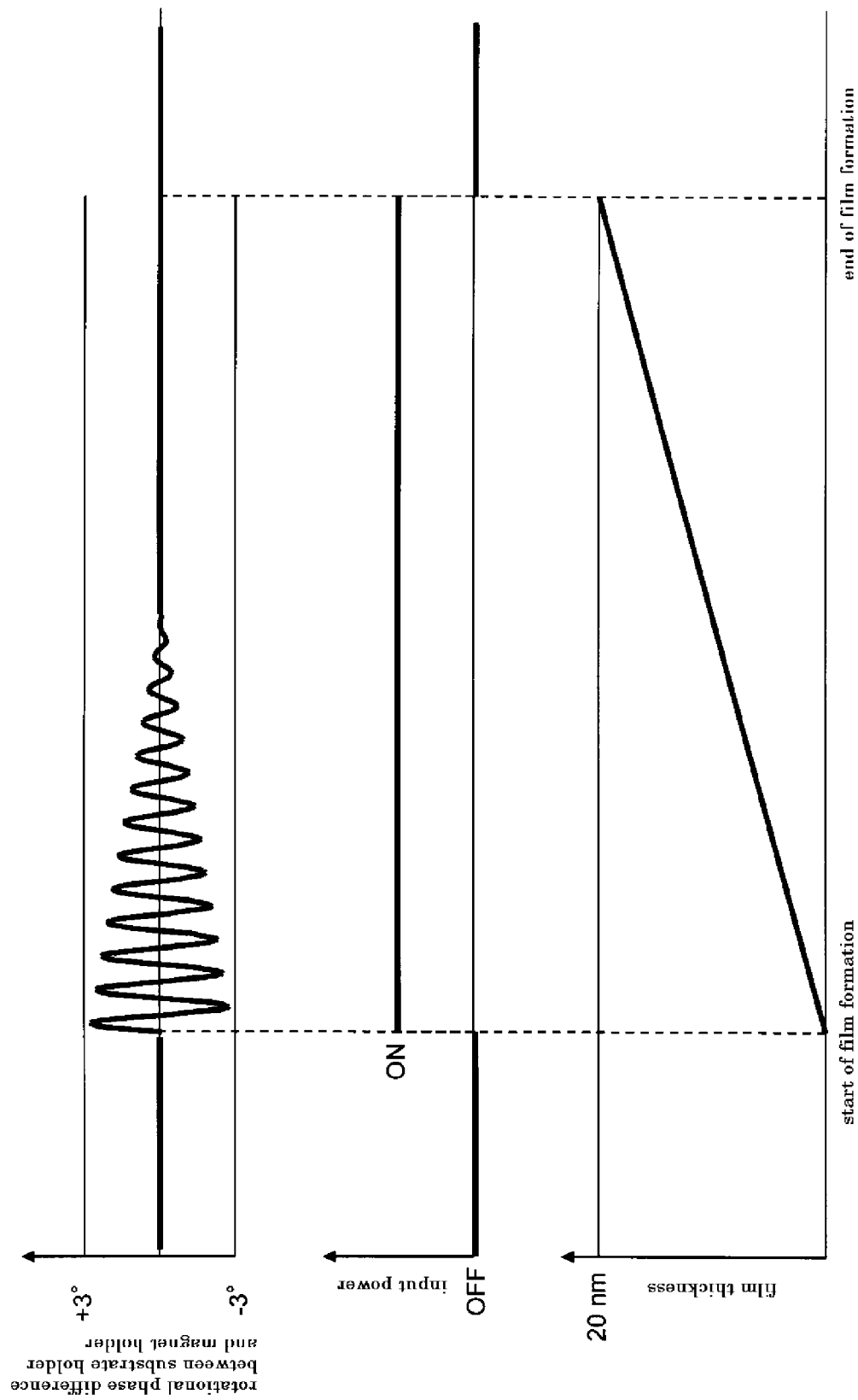
FIG. 15 is a timing chart illustrating operations in Example 4.

In Example 4, a magnetic thin film forming method to be implemented in a case where the cathode unit 50 is provided obliquely above the substrate 10 is described. FIG. 13 is an explanatory view illustrating the magnetic thin film forming method of Example 4. FIG. 14 is a plan view showing the positional relationship between the substrate and the magnet in Example 4. FIG. 15 is a timing chart illustrating operations in Example 4.

As shown in FIG. 13, in Example 4, a magnetic thin film of NiFe (nickel iron) having an axis of easy magnetization in a direction perpendicular to the orientation flat 10a is formed on the Si wafer 10 that is 6 inches in diameter and has the orientation flat 10a. The target 51 is 7.1 inches in diameter and is made of NiFe. The substrate 10 and the target 51 are positioned obliquely to each other. Here, the substrate 10 and the target 51 are positioned in an offset manner, so that the central axis of the target 51 does not pass through the center of the substrate 10.

The substrate holder 11 and the magnet holder 31 are continuously rotated in the same direction at 60 rpm by the respective rotating mechanisms 20 and 40. The positioned state in which the direction of the magnetic field applied to the substrate 10 is always perpendicular to the orientation flat 10a is maintained so that the desired axis of easy magnetization becomes perpendicular to the orientation flat 10a of the substrate 10. The parallelism of the magnetic field M formed by the magnet 30 is ±1 degree in the plane of 6 inches in diameter, and the magnetic field intensity is 7958 A/m (100 Oe (oersteds)) at the center of the substrate 10 where the magnetic field is weakest.

An Ar gas is introduced until the pressure inside the chamber becomes 0.03 Pa. After the gas pressure is stabilized, a DC power of 1 kW is supplied to the cathode to start film formation. As shown in FIG. 14, the rotation speed of the magnet holder 31 is modulated at the same time as the start of film formation, and the rotational phase difference between the substrate holder 11 and the magnet holder 31 is varied. In this manner, the swinging variation is controlled, with the magnetic field orientation with respect to the axis of easy magnetization being a deflection angle (the relative angle) of ±3 degrees. Also, the rotational phase difference is controlled to become smaller as the film formation progresses. More specifically, in a process to form a thin film of 20 nm in thickness, the rotational phase difference is controlled to become zero when the film thickness becomes 10 nm, and the remaining 10 nm of the film is formed while the rotation is performed at a constant speed so that the orientation flat 10a and the magnetic field orientation are held in a vertical state. This situation is illustrated in the timing chart of FIG. 15.

With this structure, the variation in axis of easy magnetization can be reduced as in Example 1. Particularly, where the target 51 is placed in an offset manner with respect to the substrate 10, uniform film formation can be performed even if the target diameter is smaller than that in Example 1.

Example 5

Example 5 is an example case where a plasma processing apparatus according to the present invention is applied to an apparatus for manufacturing tunnel magnetoresistive devices. FIG. 16 is a plan view showing an example structure of an apparatus for manufacturing thin film devices.

As shown in FIG. 16, the apparatus 100 for manufacturing thin film devices (tunnel magnetoresistive devices) includes a vacuum transportation chamber 110 at its center, and two vacuum transporting mechanisms 111 formed with handling robots or the likes are provided in the vacuum transportation chamber 110. Three sputtering film formation chambers 120A, 120B, and 120C are connected to the vacuum transportation chamber 110 via gate valves 160. Also, an etching chamber 130 for physically removing impurities from the process surface of the substrate 10, and an oxidation chamber 140 for oxidizing metal thin films are connected to the vacuum transportation chamber 110 via gate valves 160. Further, two load lock chambers 150 for transporting the substrate 10 between a vacuum space and the atmosphere is connected to the vacuum transportation chamber 110.

Five cathode units 50 are arranged at regular intervals in the circumferential direction on the upper wall of each of the sputtering film formation chambers 120A, 120B, and 120C. Each of the cathode units 50 is mounted in such a manner that the substrate 10 and the target 51 are arranged obliquely with respect to each other as in Example 4. Also, a substrate holder 11 including a rotating mechanism 20 and a magnet holder 31 including a rotating mechanism 40 are provided to each of the sputtering film formation chambers 120A, 120B, and 120C. A permanent magnet 30 that generates a parallel magnetic field of ±1 degree or less within the range of 200 mm in diameter is supported on each magnet holder 31.

Figure 17:
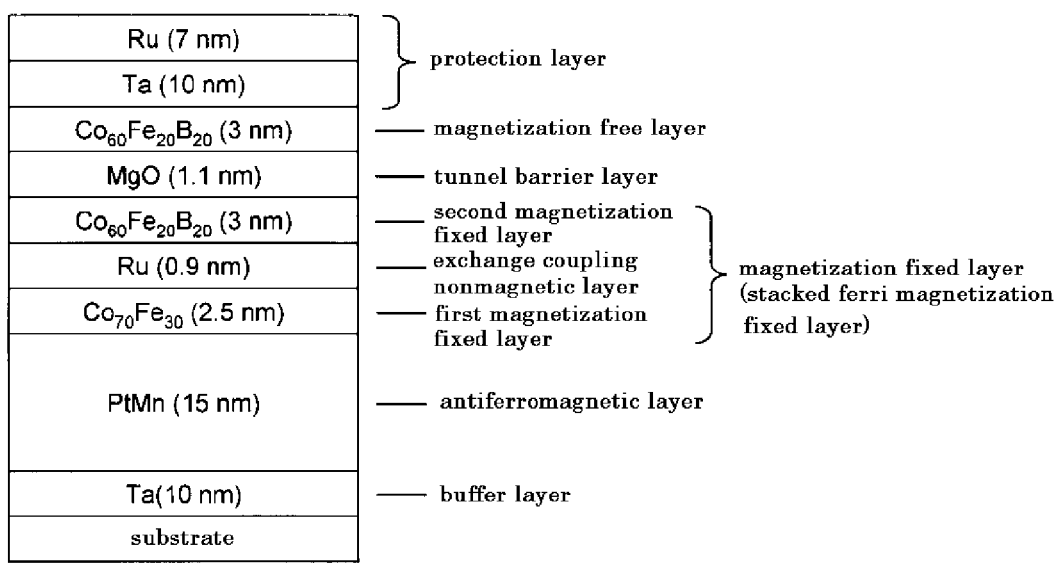
FIG. 17 is a schematic view showing the film structure of a tunnel magnetoresistive device manufactured by the manufacturing apparatus of Example 5.

FIG. 17 is a schematic view showing the film structure of a tunnel magnetoresistive device manufactured by the manufacturing apparatus of Example 5. As shown in FIG. 17, the film structure of the tunnel magnetoresistive device includes Ta (10 nm), PtMn (15 nm), $Co_{70}Fe_{30}$ (2.5 nm), Ru (0.9 nm), $Co_{60}Fe_{20}B_{20}$ (3 nm), MgO (1.1 nm), $Co_{60}Fe_{20}B_{20}$ (3 nm), Ta (10 nm), and Ru (7 nm) in this order from the substrate side. To obtain this film structure, a Ta target, a PtMn target, and a CoFe target are attached to the sputtering film formation chamber 120A. A Ru target, a CoFeB target, and a Mg target are attached to the sputtering film formation chamber 120B. A CoFeB target, a Ta target, and a Ru target are attached to the sputtering film formation chamber 120C.

To manufacture the tunnel magnetoresistive device, the substrate 10 transported from the atmosphere into the vacuum space via the load lock chambers 150 is transported into the etching chamber 130, and the moisture adhering to the process surface of the substrate 10 in the atmosphere is physically removed by etching.

The substrate 10 is then transported into the sputtering film formation chamber 120A, and a Ta layer, a PtMn layer, and a CoFe layer are formed one by one by sputtering. To form the Ta and PtMn layers that are nonmagnetic materials, the magnet holder 31 is not rotated, but the CoFe layer that is a magnetic material is formed in a magnetic field by using the method of Example 4.

The substrate 10 is then transported into the sputtering film formation chamber 120B, and a Ru layer, a CoFeB layer, and a Mg layer are formed one by one by sputtering. To form the Ru and Mg layers that are nonmagnetic materials, the magnet holder 31 is not rotated, but the CoFeB layer that is a magnetic material is formed in a magnetic field by using the method of Example 4.

After that, the substrate 10 is transported into the oxidation chamber 140, and only the Mg layer that is the outermost layer is oxidized to form a MgO layer.

The substrate 10 is then transported into the sputtering film formation chamber 120C, and a CoFeB layer, a Ta layer, and a Ru layer are formed one by one by sputtering. To form the Ta and Ru layers that are nonmagnetic materials, the magnet holder 31 is not rotated, but the CoFeB layer that is a magnetic material is formed in a magnetic field by using the method of Example 4.

In the above manner, a magnetic thin film forming method and apparatus according to the present invention can be applied to an apparatus for manufacturing tunnel magnetoresistive devices, and tunnel magnetoresistive devices having magnetic thin films with a smaller variation in axis of easy magnetization can be obtained.

[Industrial Applicability]

The film forming method according to the present invention can be implemented as a method for forming films with the use of not only a sputtering apparatus, but also any other plasma processing apparatus including a vacuum container, such as a dry etching apparatus, a plasma usher apparatus, a CVD apparatus, or a liquid crystal display manufacturing apparatus.

[Explanation Of Reference Numerals]
1 plasma processing apparatus
2 chamber
10 substrate
11 substrate holder
20 rotating mechanism of substrate holder
25 rotational position sensor for substrate holder
30 magnet
31 magnet holder
40 rotating mechanism of magnet holder
45 rotational position sensor for magnet holder
60 control device

The invention claimed is:

1. A plasma processing apparatus comprising:
a substrate holder that supports a substrate;
a magnet holder that is provided around the substrate holder, and supports a magnet that forms a magnetic field in the process surface of the substrate;
a rotating mechanism that is capable of rotating one or both of the substrate holder and the magnet holder along the planar direction of the process surface of the substrate;
a rotational position sensor that detects a rotating position or rotating positions of the substrate holder and/or the magnet holder; and
a control device that controls the rotating mechanism of the substrate holder and/or the magnet holder,
the control device controlling the rotating mechanism of the substrate holder and/or the magnet holder by the following steps based on a detection signal of the rotational position sensor,
a storage unit of the control device storing an algorithm of a magnetic thin film as a film formation control program,
the film formation control program comprising the steps of:
positioning the substrate and the magnet so that an axis of easy magnetization having an orientation oriented in one direction is set in the process surface of the substrate when the substrate holder and the magnetic holder are set in a rest state at the initial stage of forming the magnetic thin film by sputtering, and swingingly varying the substrate holder and the magnetic holder in mutually opposite directions so that a relative angle between the axis of easy magnetization set in a process surface of the substrate and the magnetic field generated by the magnet falls within a prescribed range;
swingingly varying the substrate holder and the magnetic holder in mutually opposite directions, so that a deflection of the relative angle between the axis of easy magnetization set in the process surface of the substrate and the magnetic field generated by the magnet becomes gradually smaller as the film formation of the magnetic thin film by sputtering progresses; and
making the substrate and the magnet rested in a positioned state so that the relative angle between the axis of easy magnetization set in the process surface of the substrate and the magnetic field generated by the magnet becomes zero, by ending the swinging variation of the substrate holder and/or the magnetic holder, when a remaining portion of the magnetic thin film is formed by sputtering.

2. The plasma processing apparatus according to claim 1, wherein the control device controls the swinging variation to cause a maximum relative angle to fall within a range of up to 5 degrees greater than 0 or up to 5 degrees less than 0.

* * * * *